US008118939B2

(12) United States Patent
Atlas et al.

(10) Patent No.: US 8,118,939 B2
(45) Date of Patent: Feb. 21, 2012

(54) TEMPERATURE CONTROL UNIT FOR BUBBLERS

(75) Inventors: Boris Atlas, San Jose, CA (US); Yefim Bichutskiy, Sunnyvale, CA (US); Boris Bruk, San Jose, CA (US)

(73) Assignee: Noah Precision, LLC, Morgan Hill, CA (US)

(*) Notice: Subject to any disclaimer, the term of this patent is extended or adjusted under 35 U.S.C. 154(b) by 234 days.

(21) Appl. No.: 11/378,664

(22) Filed: Mar. 17, 2006

(65) Prior Publication Data

US 2006/0213446 A1 Sep. 28, 2006

Related U.S. Application Data

(60) Provisional application No. 60/663,000, filed on Mar. 17, 2005, provisional application No. 60/663,072, filed on Mar. 17, 2005.

(51) Int. Cl.
*C23C 16/00* (2006.01)
*B01D 47/00* (2006.01)
(52) U.S. Cl. ............ 118/726; 261/19; 261/DIG. 65
(58) Field of Classification Search ........... 122/18.2, 122/19.2, 31.2, 494; 220/567.3, 694.1; 261/19, 261/75, 127, DIG. 65
See application file for complete search history.

(56) References Cited

U.S. PATENT DOCUMENTS

| | | | | |
|---|---|---|---|---|
| 3,470,902 A | | 10/1969 | Hackman | |
| 4,269,057 A | * | 5/1981 | Ong et al. | 73/1.03 |
| 4,441,925 A | * | 4/1984 | Ishizuka | 75/619 |
| 4,612,772 A | * | 9/1986 | Jones | 62/3.3 |
| 4,911,101 A | * | 3/1990 | Ballingall et al. | 118/715 |
| 5,014,727 A | * | 5/1991 | Aigo | 134/102.2 |
| 5,039,599 A | | 8/1991 | Ueda | |
| 5,337,806 A | | 8/1994 | Trunner | |
| 5,935,647 A | * | 8/1999 | DeDontney et al. | 427/248.1 |
| 5,968,379 A | | 10/1999 | Zhao et al. | |
| 6,561,498 B2 | | 5/2003 | Tompkins et al. | |
| 2001/0042523 A1 | * | 11/2001 | Kesala | 122/6.6 |
| 2002/0145210 A1 | * | 10/2002 | Tompkins et al. | 261/121.1 |
| 2003/0075925 A1 | * | 4/2003 | Lindfors et al. | 285/367 |
| 2003/0190422 A1 | | 10/2003 | Yoo | |
| 2004/0084149 A1 | * | 5/2004 | Stamp et al. | 156/345.33 |

OTHER PUBLICATIONS

Translation of Apr. 4, 2011 Official Action issued by the Japanese Patent Office for corresponding JP patent application No. 2008-502141, pp. 1-5.

Jul. 1, 2011 Instructional letter in response to Apr. 4, 2011 Official Action for corresponding JP patent application No. 2008-502141, p. 1.

(Continued)

*Primary Examiner* — Karla Moore
*Assistant Examiner* — Nathan K Ford
(74) *Attorney, Agent, or Firm* — Dorsey & Whitney LLP

(57) ABSTRACT

A temperature control device for use in a process reactor system with a bubbler having a container provided with a side wall. The device includes a vessel having an internal chamber adapted to receive the container of the bubbler. An enclosure member is extendable between the container of the bubbler and the vessel for enclosing the side wall of the container within the internal chamber. A temperature-changing device is coupled to the vessel for providing heat or cold to the internal chamber.

16 Claims, 14 Drawing Sheets

OTHER PUBLICATIONS

Sep. 18, 2007 International Preliminary Report on Patentability issued by the International Bureau of WIPO for corresponding PCT patent application serial No. PCT/US2006/010037, pp. 1-5.

Jul. 10, 2007 International Search Report issued by the RO/US for corresponding PCT application serial No. PCT/US2006/010037, p. 1.

Oct. 5, 2010 Supplementary European Search Report issued by the European Patent Office for patent application serial No. EP 06738999.9, pp. 1-6.

Apr. 4, 2011 Instructional letter in response to the Supplementary European Search Report issued by the European Patent Office for corresponding patent application serial No. EP 06817405.1, pp. 1-8.

* cited by examiner

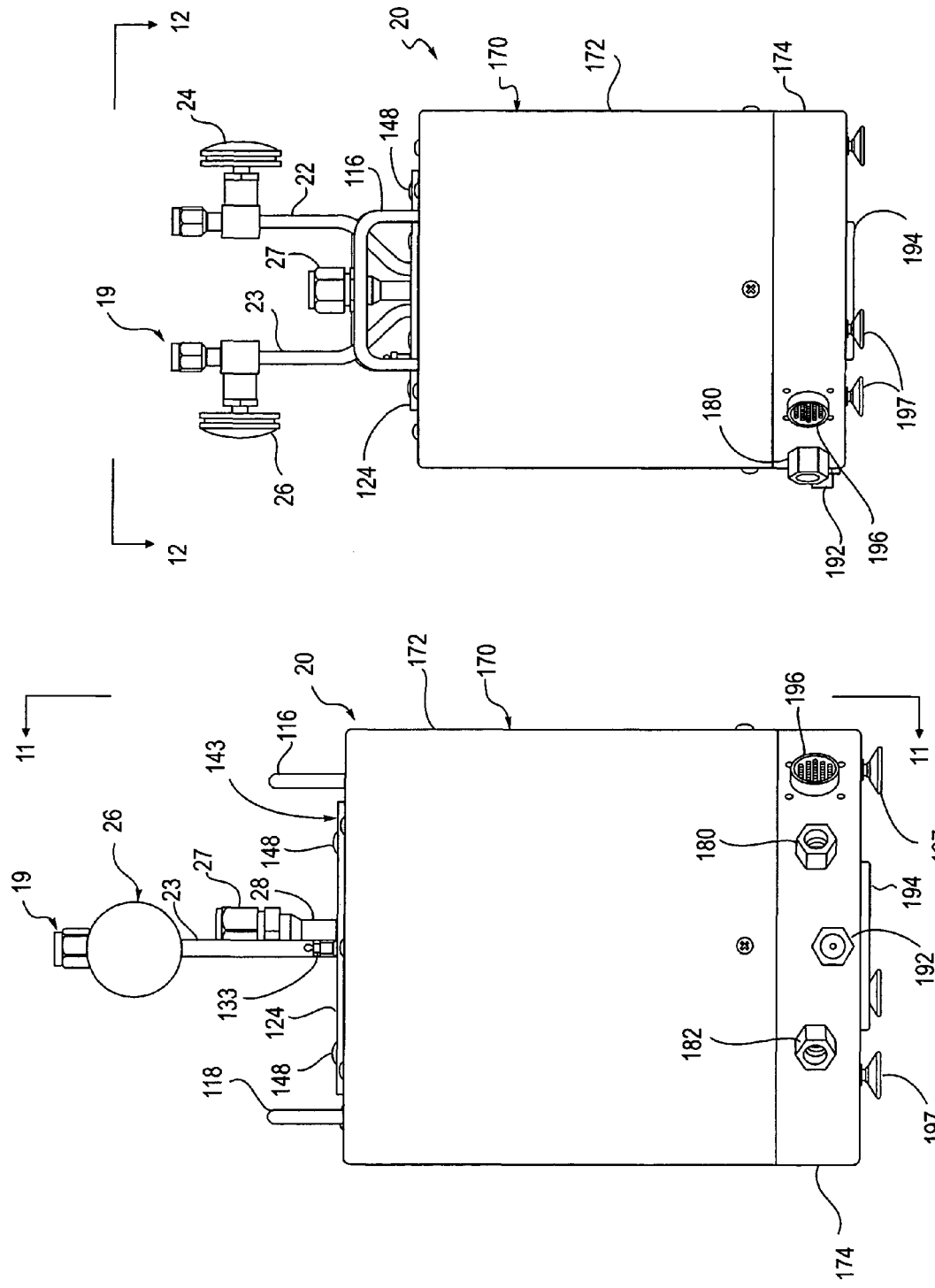

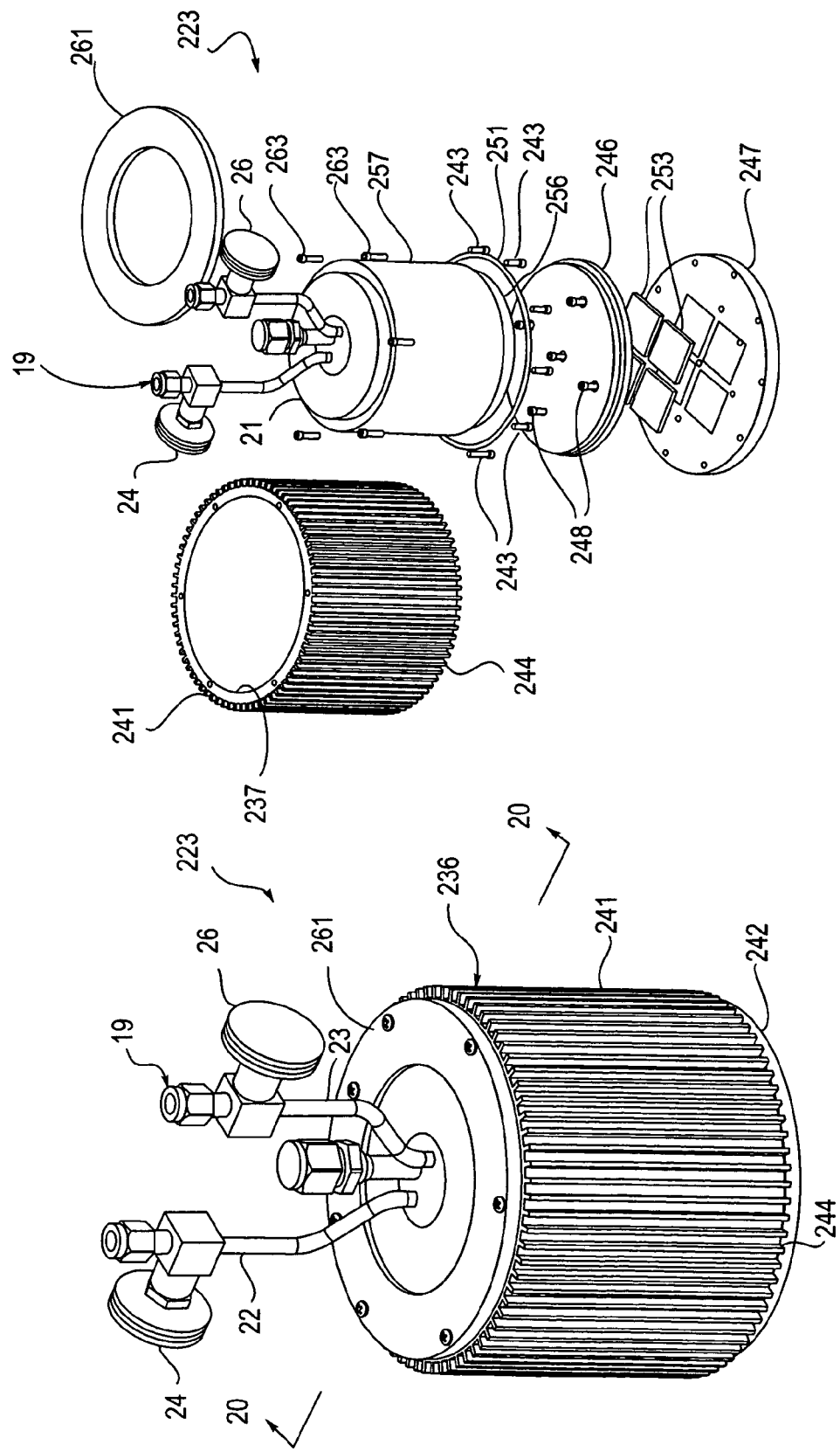

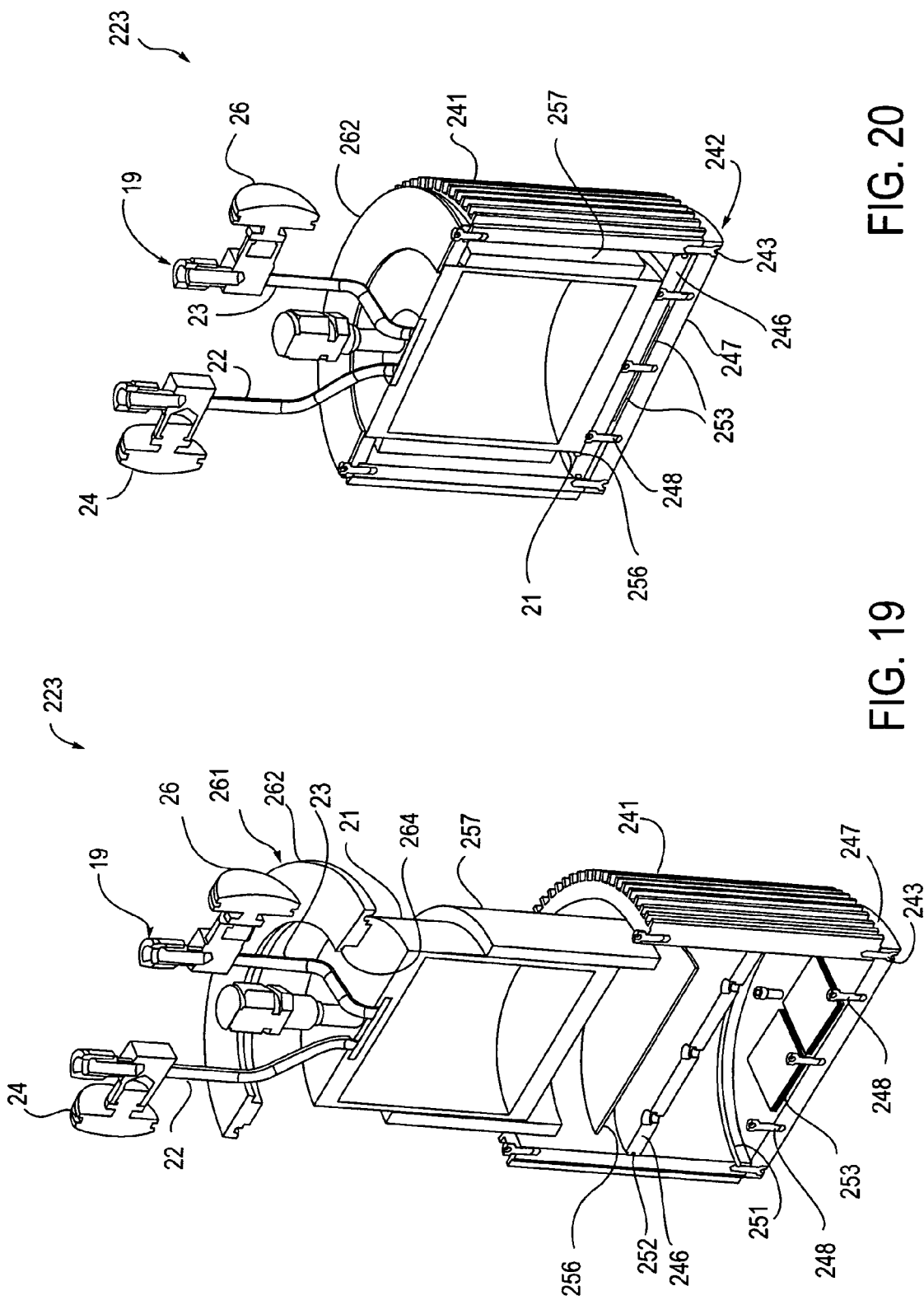

TEMPERATURE CONTROL UNIT FOR BUBBLERS

CROSS REFERENCE TO RELATED APPLICATIONS

This application claims the benefit of U.S. Provisional Application Ser. No. 60/663,000 filed Mar. 17, 2005 and U.S. Provisional Application Ser. No. 60/663,072 filed Mar. 17, 2005, the entire content of each of which is incorporated herein by this reference.

FIELD OF THE INVENTION

The present invention relates in general to temperature control units for semiconductor wafer processing, and more particularly to temperature control units for bubblers used by process reactor systems.

BACKGROUND OF THE INVENTION

Process reactor systems are used in semiconductor technology to etch or deposit materials on semiconductor wafers. For example, a metal-organic chemical vapor deposition (MOCVD) reactor can be used to deposit high-dielectric-constant (high-K) dielectric films in the area of semiconductor nanochips technology, or to grow a crystal in the area of optoelectronics technology such as lasers and light emitting diodes (LED). Some of these processes build on the concept of atomic layer deposition (ALD) and employ gases made of small molecules.

In a typical process using a precursor material such as a gas or liquid of metal-organic compound, for example the MOCVD reactor, the precursor material is stored in a bubbler and delivered into a chamber of the reactor. The compound in the bubbler is usually required to have a specific temperature, defined by the process, for controlled delivery into the reactor. The required temperature of a specific compound in a bubbler may vary in the range of −20° C. to +70° C. In many conventional process reactor systems, the bubbler is placed and often submerged in a liquid of an open bath for temperature control. The bubbler and the bath may sit in an electronics or utilities enclosure, where other components and electronics of the reactor system are disposed. An open bath can lead to problems when the temperature of such liquid is above its evaporation temperature, for example room temperature, in which case the evaporation of the liquid can cause shortage or corrosion in the electronics or other instrumentation of the reactor system, particularly those inside the utility enclosure. If the temperature of the liquid in the bath is below its condensation temperature, for example room temperature, the resulting condensation may change the ratio of glycol in the reactor system. If the temperature of the liquid drops below 0° C., nearby components of the reactor system may freeze and stop operation.

Conventional apparatus for controlling the temperature of bubblers can typically take two to four hours to start up, resulting in reduced total available uptime or process time for the reactor system. Even when such apparatus are up and running, many of the currently available process reactor systems do not effectively control the temperature of the gas or compound delivered by the bubbler. Without accurate temperature control, the processes performed by the process reactor systems may be undesirably affected. For example, the temperature instability of the bath holding the bubbler can result in instability in electronics calibration and performance drift.

In certain exemplary applications, the precursor material can be a metal-organic liquid used to grow a crystal by atomic layer deposition to form part of an LED structure. Since the precursor material is used to grow a crystal inside of the reactor, it may need to be in a certain proportion with other materials when it is delivered into the chamber of the reactor. This cannot be achieved easily without precise temperature control of the bubbler because unwanted temperature changes in the metal-organic compounds often cause unwanted dose deviation during the deposition process.

SUMMARY

A temperature control device is provided for use in a process reactor system with a bubbler having a container provided with a side wall. The device includes a vessel having an internal chamber adapted to receive the container of the bubbler. An enclosure member is extendable between the container of the bubbler and the vessel for enclosing the side wall of the container within the internal chamber. A temperature-changing device is coupled to the vessel for providing heat or cold to the internal chamber.

BRIEF DESCRIPTION OF THE DRAWINGS

FIG. 10 is a side elevational view of the temperature control unit of FIG. 6 taken along the line 10-10 of FIG. 7.

FIG. 11 is a side elevational view of the temperature control unit of FIG. 6 taken along the line 11-11 of FIG. 10.

FIG. 17 is a perspective view of a temperature control unit of the system of FIG. 16.

FIG. 18 is a partially exploded view of the temperature control unit of FIG. 17.

FIG. 19 is a partially exploded and sectioned view of the temperature control unit of FIG. 17.

FIG. 20 is a cross-sectional view of the temperature control unit of FIG. 17 taken along the line 20-20 of FIG. 17.

DETAILED DESCRIPTION

Figure 1:
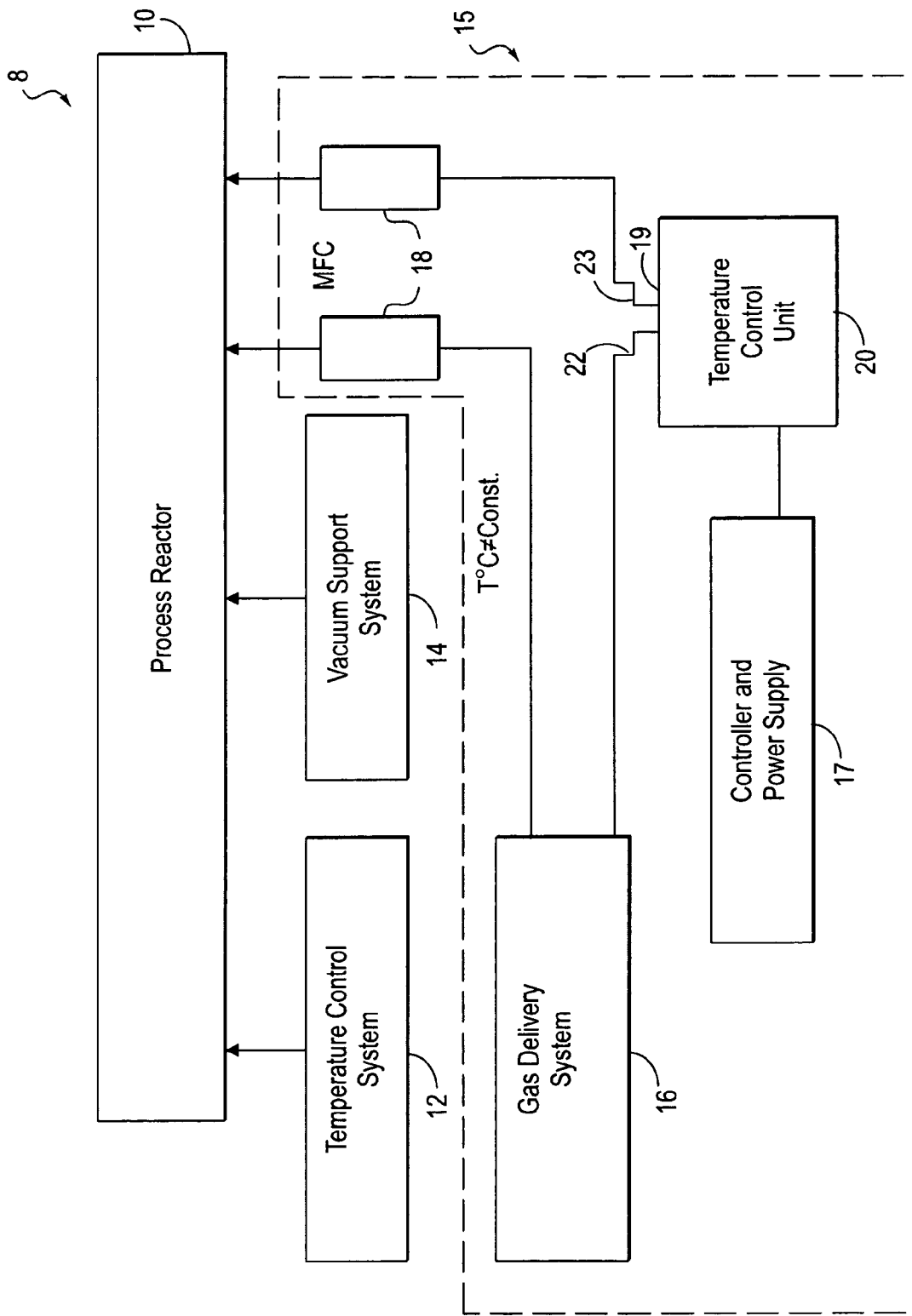
FIG. 1 is a schematic diagram of a light emitting diode manufacturing system employing a temperature control unit of the present invention.

One embodiment of the present invention can includes a temperature control unit for use with a bubbler and a process reactor in a light emitting diode (LED) manufacturing system 8 (see FIG. 1). System 8 may include a wafer temperature control system 12 for controlling the temperature of a wafer in the process reactor 10, a vacuum support system 14 for controlling the gas pressure in a vacuum chamber (not shown) associated with the process reactor 10, a gas delivery system 16 for introducing various gases into the vacuum chamber, one or more mass flow controllers (MFC) 18 for controlling the flow rate at which the gases are introduced into the vacuum chamber, at least one bubbler 19 of any suitable type for storing and delivering a liquid compound to the vacuum chamber, a temperature control unit 20 for controlling the temperature of the liquid compound stored in the bubbler 19, and a power supply and controller 17 for supplying power to and controlling the temperature control unit 20. The gas delivery system 16, mass flow controller(s) 18, bubbler(s) 19, temperature control unit(s) 20 and controller(s) 17 of the system 8 form a subsystem that can be referred to as a precursor material delivery system 15.

In one embodiment bubbler 19 may be a conventional bubbler having, as shown in FIGS. 6-13 for example, a glass or quartz container 21 for holding a reactive compound in liquid state (liquid compound), an inlet tube 22 that extends down to near a bottom of the container, and an outlet tube 23 located near a top of the container and fluidly coupling the bubbler to the vacuum chamber (not shown) of the process reactor 10. An inlet valve 24 is provided on the inlet tube 22 and an outlet valve 26 is provided on the outlet tube 23. A centrally disposed service fitting 27 is coupled to a service tube 28 that extends into the top of container 21. During the operation of the process reactor 10, a carrier gas is supplied from the gas delivery system 16 to the inlet tube 22 of the bubbler 19. The carrier gas bubbles through the liquid compound in the container 21, causing the liquid compound to vaporize, and exits together with the vaporized liquid compound through the outlet tube 23 into the vacuum chamber of the process reactor 10 through a mass flow constrictor (MFC) 18. One or more of the same or different gases may also be introduced from the gas delivery system 16 directly to the process reactor through one or more other MFCs 18.

Figure 2:
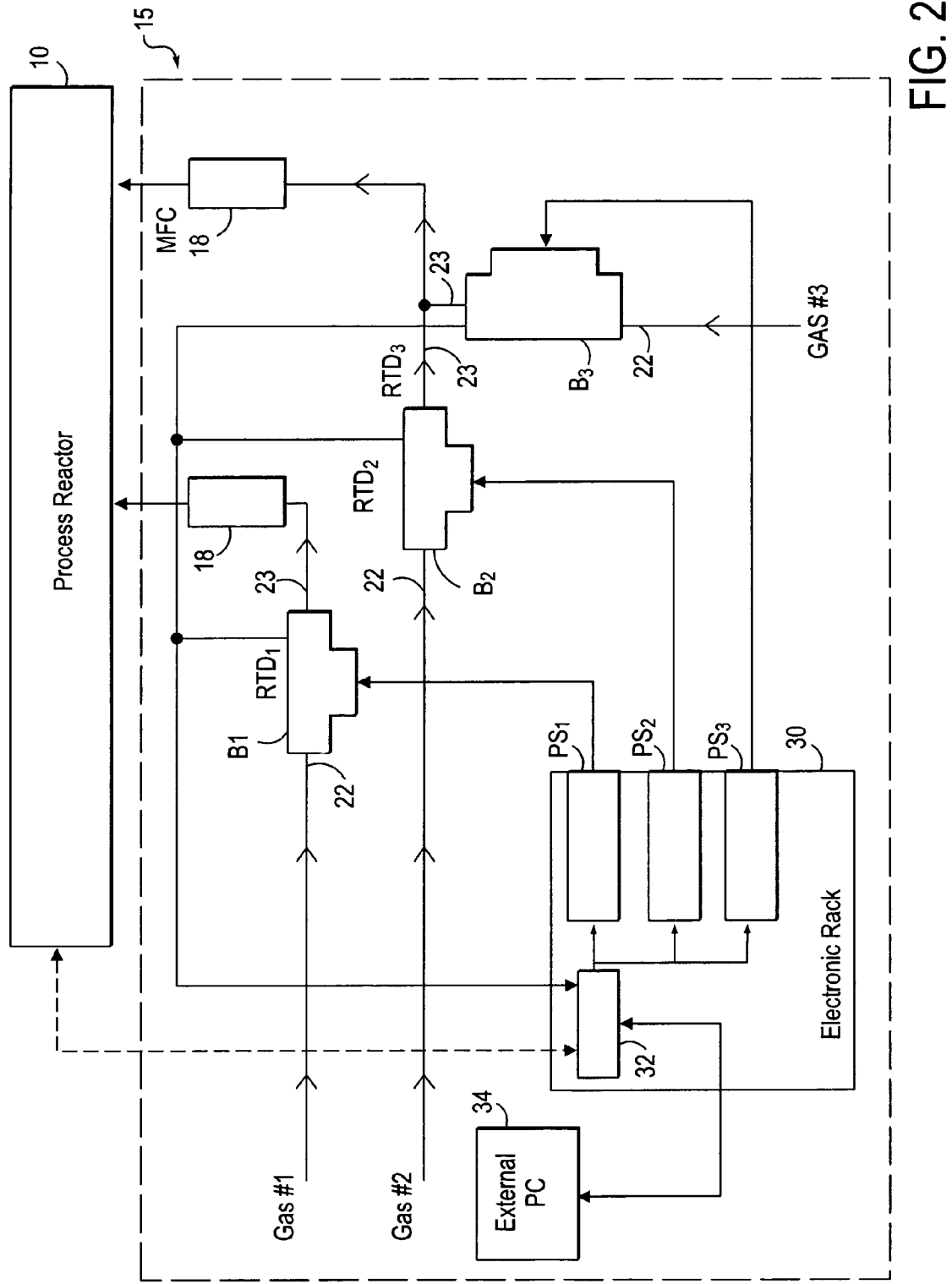
FIG. 2 is a detailed schematic diagram of a precursor material delivery system employing a plurality of temperature control units of the present invention in a light emitting diode manufacturing system of the type shown in FIG. 1.

The process reactor 10 may employ multiple bubblers, each of which can be similar to bubbler 19 and can hold a different liquid compound. As shown in FIG. 2, wherein the process reactor 10 and precursor material delivery system 15 are depicted, the process reactor 10 may employ first, second and third bubblers $B_1$, $B_2$, and $B_3$ each having its inlet tube receiving a respective gas #1, gas #2, and gas #3 and its outlet tube fluidly coupled to the process reactor 10 through an MFC 18. Each of the bubblers $B_1$, $B_2$, and $B_3$ has its temperature monitored by a respective first, second and third resistive temperature devices $RTD_1$, $RTD_2$, and $RTD_3$, and the temperature of each bubbler is controlled by a respective first, second and third thermal electric devices $TE_1$, $TE_2$, and $TE_3$ associated with first, second and third temperature control units (not shown). An electronic rack 30 is provided to facilitate control of the thermal electric devices $TE_1$, $TE_2$, and $TE_3$, and includes first, second and third power supply units $PS_1$, $PS_2$, and $PS_3$ coupled between a network hub 32 and respective first, second and third thermal electric devices $TE_1$, $TE_2$, and $TE_3$. The network hub 32 is coupled to a control interface (not shown) of the process reactor 10 and/or to a computer system 34 either directly or through a computer network. Thus, the thermal electric devices $TE_1$, $TE_2$, and $TE_3$ and the temperature of each of the bubblers $B_1$, $B_2$, and $B_3$ can be remotely controlled from the control interface of the reactor 10 and/or the computer system 34.

Figure 3:
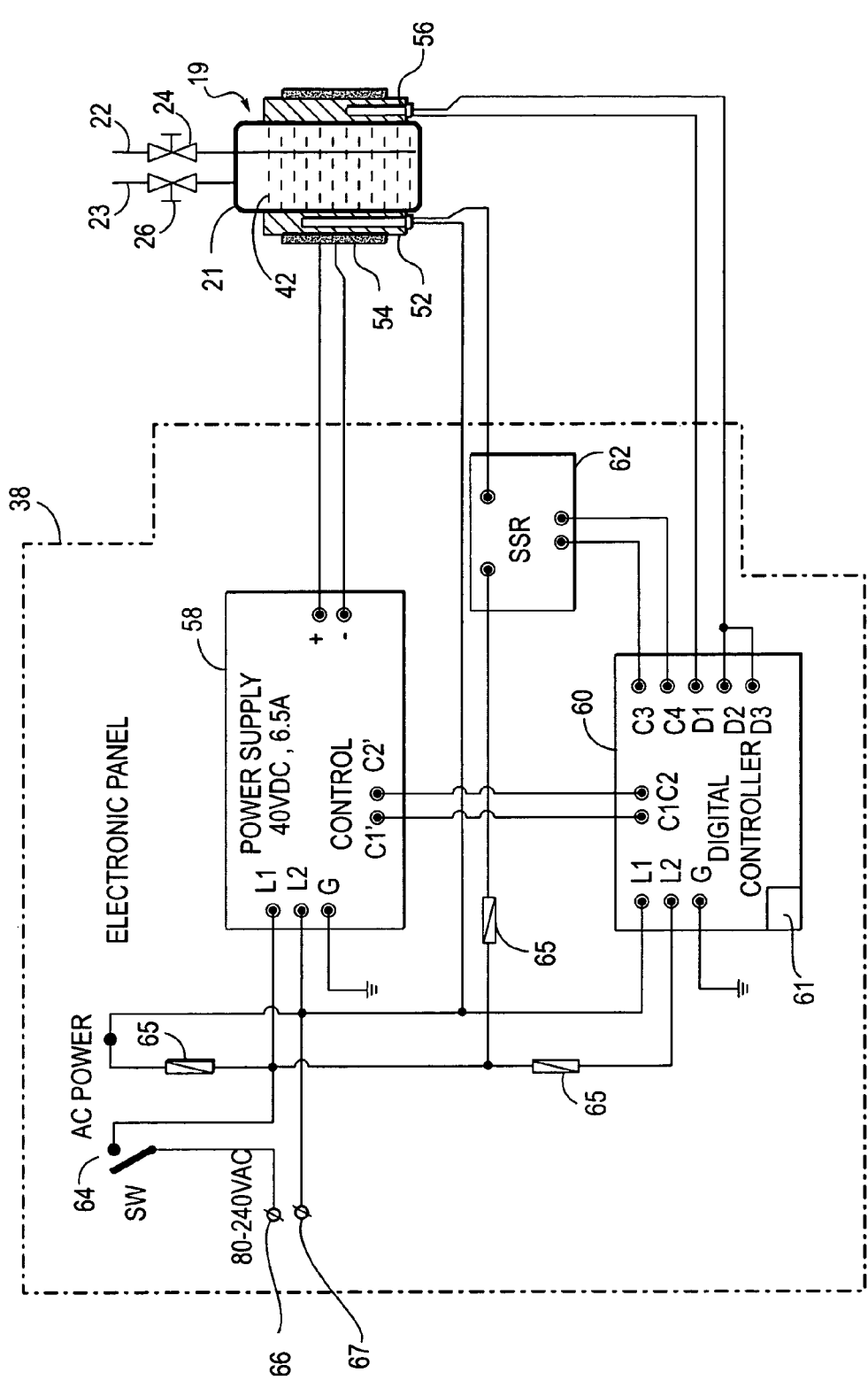
FIG. 3 is a detailed schematic diagram of a controller and power supply employed within the precursor material delivery system of FIG. 2.

A bubbler 19 and a power supply unit 38, which can be one of the power supply units $PS_1$, $PS_2$, and $PS_3$, are illustrated in FIG. 3. A heater 52, at least one thermal electronic device 54, and a resistive temperature device (RTD) 56 are provided to control and monitor the temperature of the bubbler. The power supply unit 38 includes a power supply network 58, a digital controller 60 having a DeviceNet™ link 61, a solid state relay (SSR) 62, a switch 64, one or more fuses 65, and power terminals 66 and 67 for connecting to external power supply.

The DeviceNet™ link 61 allows the digital controller 60 to be connected to the network hub 32 via a DeviceNet™ network (not shown), which is a standardized, open, and low-level network that provides connections between simple industrial devices (such as controllers, sensors and actuators) and higher-level devices (such as PLC controllers and computers). Through the DeviceNet™ network, the digital controller 60 is coupled to the computer network, to which the process reactor 10 and the computer system 34 are coupled, and has its own address in the computer network so that the digital controller 60 can be addressed and controlled from the control interface of the process reactor 10 and/or from the computer system 34. The digital controller 60 includes power ports L1, L2, and G for connecting respectively to power terminals 66 and 67 and a circuit ground, control ports C1 and C2 for controlling the power supply network 58, control ports C3 and C4 for controlling the SSR 62, and data ports D1, D2, and D3 for receiving readings from the RTD 56.

The power supply network 58 includes power ports L1, L2, and G for connecting respectively to power terminals 66 and 67 and a circuit ground, control ports C1' and C2' for receiving control signals respectively from the control ports C1 and C2 of the digital controller 60, and power output terminals P+ and P− for supplying power to the thermal electronic device 54. By controlling the power supplied from the power output terminals P+ and P−, which is dependent on the control signals received at control ports C1' and C2' from the digital controller 60, the rate at which the thermal electronic device 54 removes heat from or supplies heat to the bubbler 19 can be controlled. The SSR 62, which is a solid state switching device that completes or interrupts a circuit electrically with no moving parts, is coupled between the heater 52 and one of the power terminals 66 and 67, and is configured to connect or disconnect the heater 52 to or from the power terminal based on control signals from the control ports C3 and C4 of the digital controller 60.

For maintaining the liquid compound 42 in the bubbler 19 at a desired temperature, the digital controller 60 receives the temperature reading from the RTD 56, and based thereon adjusts the power supplied to the thermal electronic device 54 and thus the rate at which the device 54 removes heat from or supplies heat to the bubbler 19 as a function of the difference between the desired temperature and the temperature reading. The controller 60 may also be used to operate SSR 62 so as to activate heater 52 for a period of time when the temperature reading from RTD 56 is significantly below the desired temperature, in which case the heater 52 may be more efficient at bringing the temperature of the liquid compound 42 in the bubbler 19 to the desired temperature.

Figure 4:
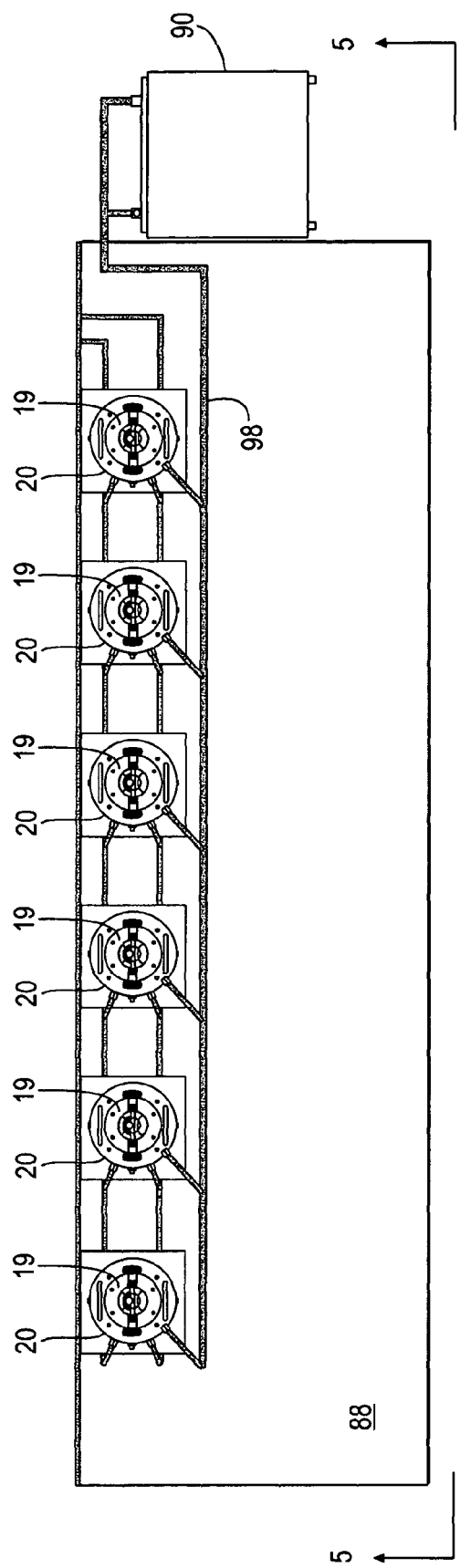
FIG. 4 is a top plan view of a physical embodiment of a portion of the precursor material delivery system of FIG. 2 employing a plurality of temperature control units of the present invention.
Figure 5:
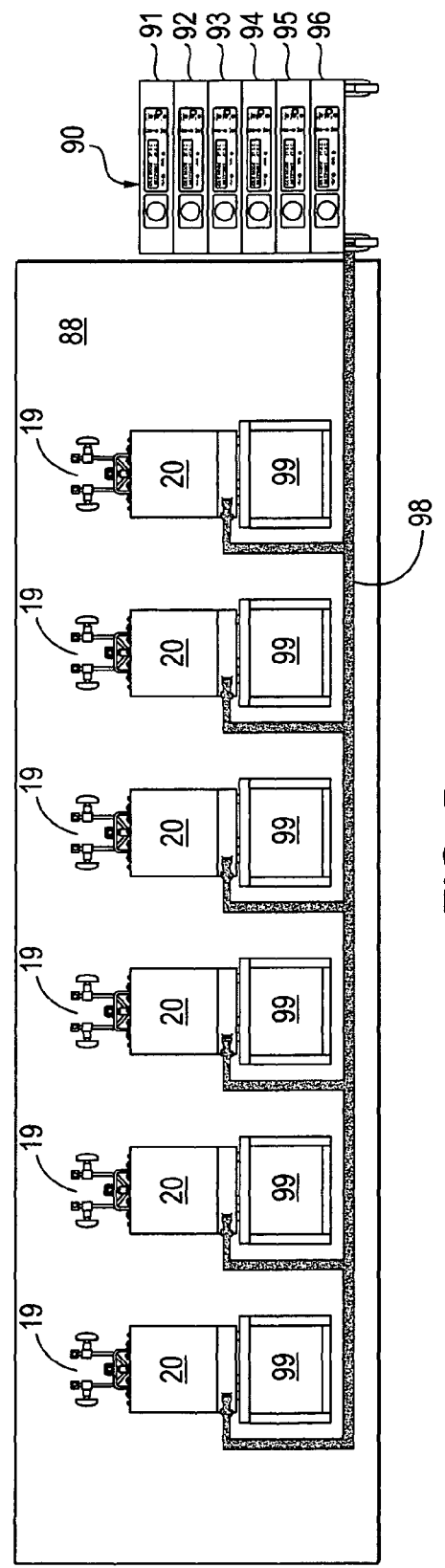
FIG. 5 is a front elevational view of FIG. 4 taken along the line 5-5 of FIG. 4.

The process reactor 10 can employ a plurality of bubblers 19, each containing a different liquid compound for use in a semiconductor manufacturing process, and a plurality of temperature control units 20, each for controlling the temperature of a respective bubbler 19, such bubblers and temperature control devices being disposed in any suitable configuration. For example, a top-down view of a portion of the precursor material delivery system 15 is illustrated in FIGS. 4 and 5 and includes six bubblers 19 and six temperature control units 20 for controlling respectively the temperature of the bubblers 19. The bubblers 19 and the temperature control units 20 are disposed in a utility housing 88, which is a sealed environment separate from the reactor housing and containing other utilities such as the temperature control system 12 and vacuum support system 14 for servicing the process reactor. In the portion of the delivery system 15 shown in FIGS. 4 and 5, electronic rack 90 of power supply units is preferably disposed outside the utility housing or enclosure 88 for remotely controlling the temperature control units 20. An electrical cable 98 is provided for electrically coupling the temperature control units 20 to the electronic rack 90 of power supply units. FIG. 5 illustrates a side view of the portion of the system 15 shown in FIG. 4, in which it is shown that the electronic rack 90 includes six power supply units 91-96, one power supply unit for each of the temperature control units 20. It is appreciated, however, that a single power supply unit can be provided for operating a plurality of temperature control units 20.

Figure 6:
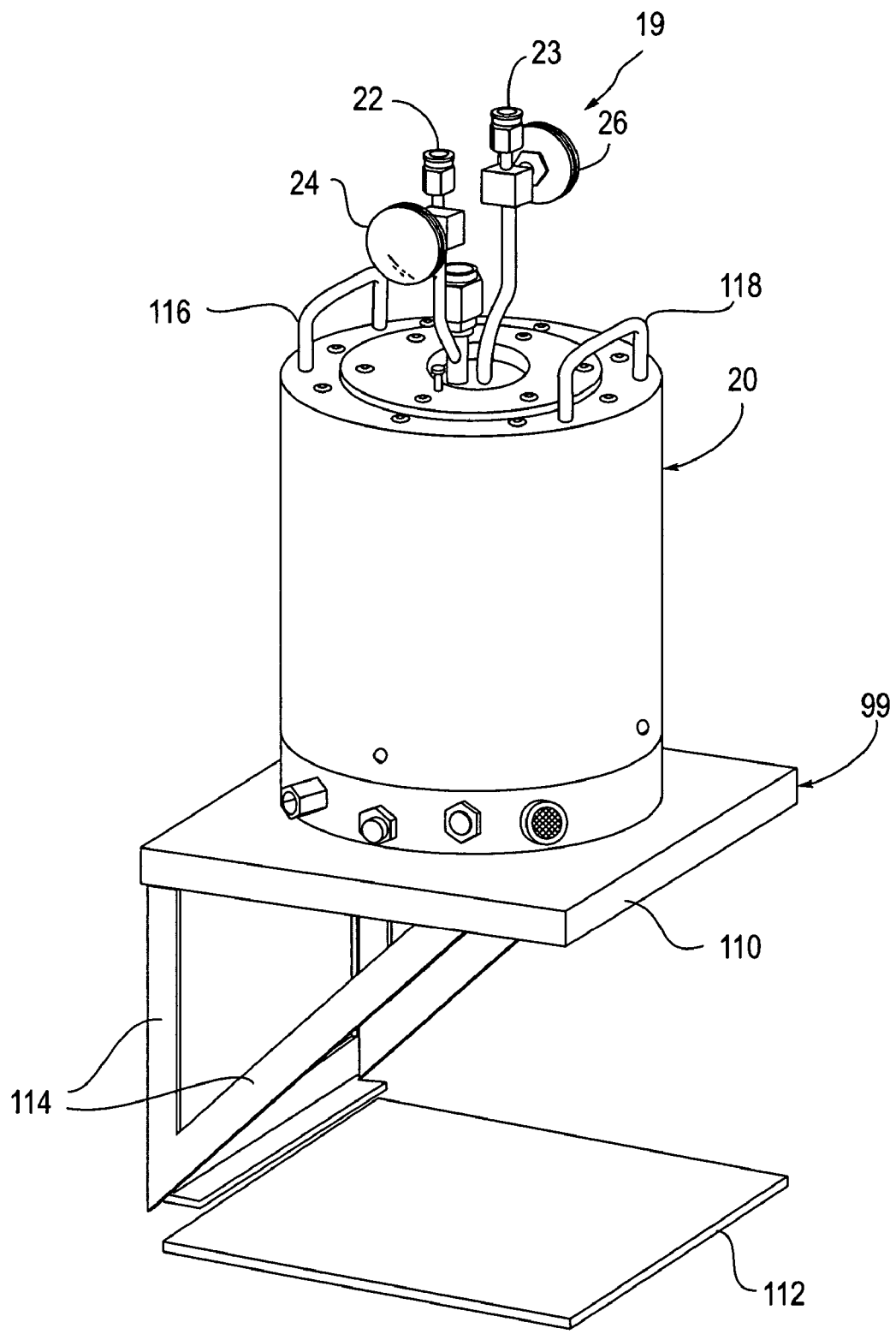
FIG. 6 is a perspective view of a temperature control unit and platform of the portion of the precursor material delivery system of FIG. 4.
Figure 7:
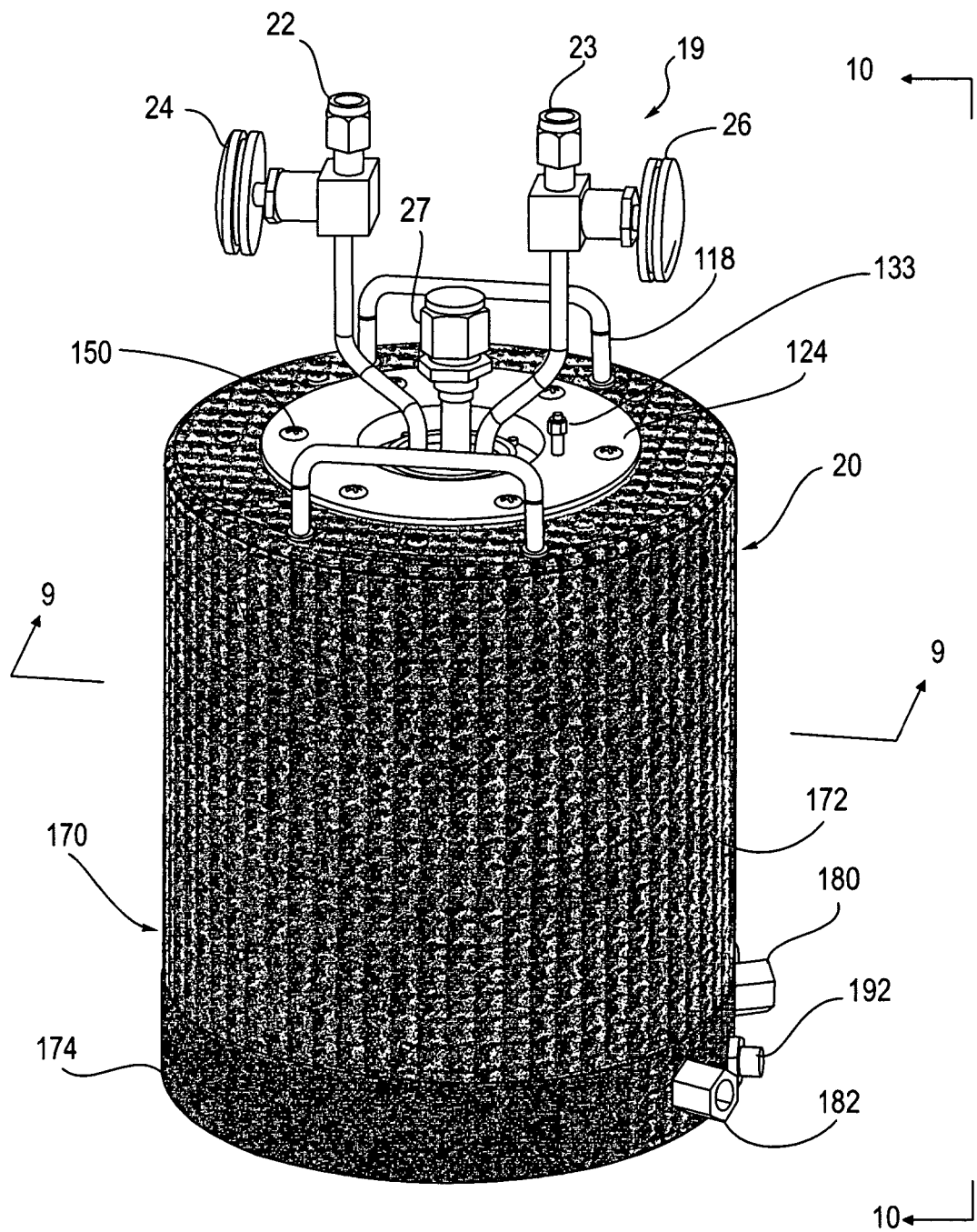
FIG. 7 is a detailed perspective view the temperature control unit of FIG. 6.
Figure 8:
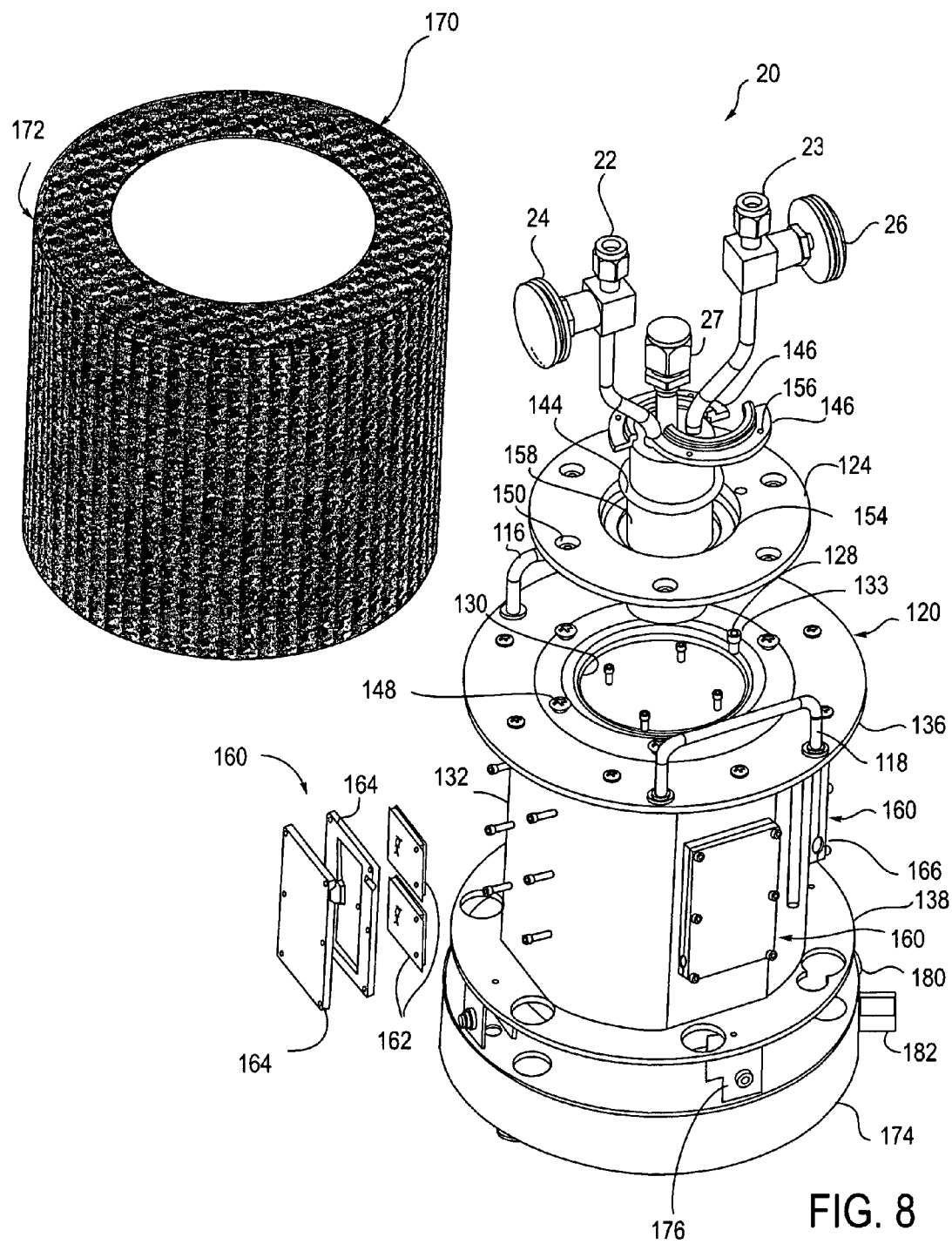
FIG. 8 is a partially exploded view of the temperature control unit of FIG. 6.

In the exemplary configuration of FIGS. 4 and 5, the temperature control units 20 are shown in a spaced-apart linear configuration inside the utility housing 88. Each of the temperature control units 20 may rest on a support or platform 99, such as a stand, which as illustrated in FIG. 6 can include an elevated platform 110 supported above a base 112 by any suitable means such as a plurality of brackets 114. Each of the temperature control units 20 has a container in which the respective bubbler 19 is submerged. Each of the temperature control units 20 may also include first and second handles 116 and 118 to allow easy grasping of the temperature control unit by human hands.

The temperature control unit of the present invention can be of any suitable configuration. In one embodiment, illustrated in FIGS. 6-14, the temperature control unit 20 includes a container, tank or vessel 120 for receiving the bubbler 19 and encloses the container 21 of the bubbler 19 in the tank with a removable flange 124 so as to minimize if not preclude evaporation of the liquid in the tank 120. The tank 120 can be made from any suitable material such as stainless steel, aluminum or copper, and in any suitable manner, and has an internal cavity or chamber 128, an open top end 130, a cylindrical side wall 132, a breathing hole 133 for maintaining atmospheric pressure within chamber 128, and a generally planar base 134 secured to the lower end of the side wall 132 by any suitable means such as bolts, screws or other fasteners (see FIGS. 8 and 9). The tank 120 further includes an annular upper flange 136 and a lower annular flange 138, which are secured to the respective upper and lower ends of the cylindrical side wall 132 in any suitable manner. For example, the lower end of the cylindrical side wall 132 is provided with an annular groove 140 for receiving the inner periphery of the slower annular flange 138, which is thus trapped between the cylindrical side wall 132 and the base 134 of the tank 120 (see FIG. 9). Similarly, the upper end of the cylindrical side wall is provided with an annular groove 142 for receiving the inner periphery of the upper annular flange 136 (see FIG. 13). The tank 120 and its chamber 128 are sized and shaped so as to receive the containers 21 of most currently available bubblers 19.

The removable flange 124 is part of an enclosure member, lid or cover that is sized and shaped for the specific bubbler 19 being used with the temperature control unit 20. For example, as shown in FIGS. 7-12, the removable flange 124 may be part of a sizing kit or sealing structure 143 which includes the removable flange 124, an O-ring 144 and a clamp 146. The removable flange 124 and the clamp 146 can each be made from a suitable material, preferably a thermal insulative material such as plastic, while the O-ring 144 may be made from rubber or any other suitable elastomeric material. It is appreciated that any suitable structure or assembly can be provided for sealing the bubbler within the tank and that any such structure or assembly can be designed and constructed to accommodate one of a plurality of bubblers of different sizes, shapes and dimensions.

In the embodiment shown in FIGS. 6-14, the annular-shaped upper flange of the sealing structure 143 is secured to the upper end of the tank 120, that is the upper end of the cylindrical side wall 132 of the tank 120, by any suitable means, such as a plurality of circumferentially disposed bolts or other fasteners 148 which extend through respective bores 150 in the removable flange 124 and threadedly seat within respective threaded bores 152 provided in the top of side walls 132 of the tank 120. An optional additional O-ring 153 can be included in the sealing structure 143 and disposed between the removable flange 124 and the tank 120 for enhancing the fluid-tight seal between the sealing structure 143 and the tank 120 (see FIG. 9). The inner periphery of the upper flange 136 of the tank 120 may be trapped between the removable flange 124 and the upper end of the cylindrical side wall 132 of the tank 120. The removable flange 124 is provided with a central opening 154 through which the container 21 of the bubbler 19 is inserted for placement in the tank 120 (see FIG. 13). The O-ring 144 is placed around the bubbler and seated on the top of the removable flange 124, for example in an annular groove formed on the top of the flange 124. The annular-shaped clamp 146 is then positioned around the top of the bubbler container and pressed against the O-ring 144 and the removable flange 124.

Figure 12:
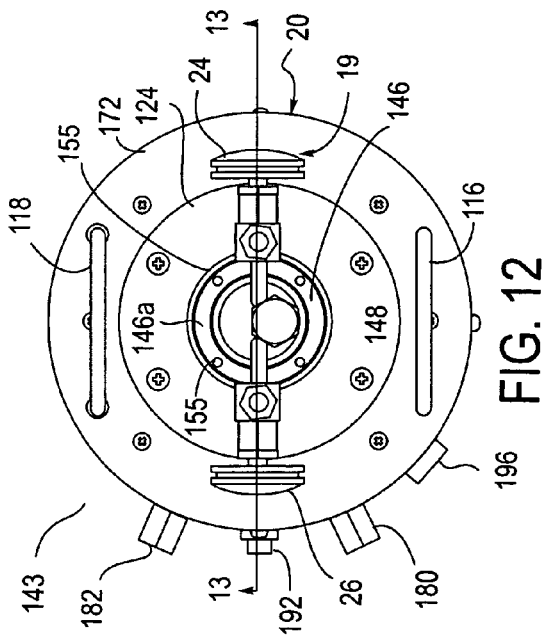
FIG. 12 is a top plan view of the temperature control unit of FIG. 6 taken along the line 12-12 of FIG. 11.
Figure 14:
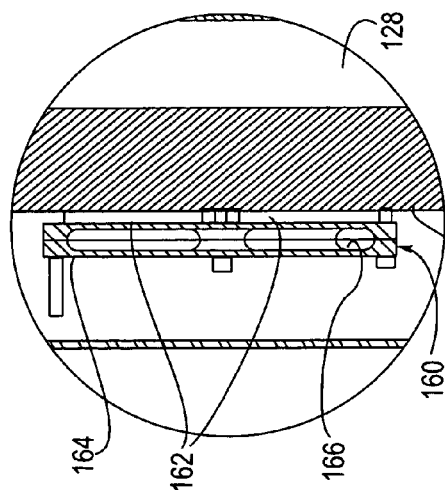
FIG. 14 is an enlarged view of the temperature control unit of FIG. 6 taken at the circle 14-14 of FIG. 13.

In one embodiment, the clamp 146 is a split-ring clamp, that is a ring formed from two semicircular halves 146a and 146b, and is removably secured to the flange 124 by any suitable means, such as for example a plurality of circumferentially-disposed bolts or other fasteners 155 that extend through respective bores (not shown) provided in the clamp and threadedly seat within respective bores (not shown) provided in the upper flange (see FIG. 12). The bolts or screws 155 squeeze the O-ring 144 and close any gap between the removable flange 124 and the outside diameter of the bubbler 19. The interior rim of each half 146a and 146b of the clamp is preferably formed with a shoulder 156 which secures the position of the bubbler 19 inside of the tank 120 (see FIG. 13). Different sealing structure or sizing kits 143 can be used when bubblers 19 of other size, shape and dimension are placed in the tank 120 of the temperature control device 20.

The sealing structure 143 serves to seal the internal cavity or chamber 128 of the tank 120 when a bubbler container 21 is placed therein. A suitable fluid, preferably a working liquid such as fluorinert, is optionally provided in the chamber 128 and around the bubbler. The sealing of the tank 120 precludes evaporation of the working liquid and facilitates controlling the temperature of such liquid. In this regard, the temperature-controlled liquid within the tank 120 is isolated from environment external to the bubbler 19, including any electronics associated with the process reactor 110 that could be damaged from moisture such as evaporation from the working liquid.

The temperature of the working fluid in the tank 120 can be controlled by any suitable means. In one embodiment, as shown in FIGS. 8 and 9 and 13 and 14, the temperature control unit 20 may include at least one heat exchanger apparatus 160 for controlling the temperature of the working fluid in the tank 120. When a plurality of heat exchanger apparatus 160 are provided, the heat exchange apparatus are preferably disposed about the cylindrical side wall 132 of the tank in circumferentially spaced-apart positions. Each of the heat exchange apparatus 160 may include one or more thermal electric devices 162 and a heat exchanger housing 164 placed in juxtaposition with the thermal electric devices 162 for removing heat or cold from the devices. As such, the thermal electric devices 162 are sandwiched between the tank 120 and the respective heat exchanger housing 164 of the heat exchanger apparatus 160 for heating or cooling the tank 120 and thus the working liquid therein. Each heat exchanger housing 164 is made from any suitable material such as stainless steel and formed from two halves or shells. The shells are each provided with an internal recess for forming an internal chamber within the heat exchanger that is accessible by an inlet 166 and an outlet 168, which can respectively be a facility water inlet and a facility water outlet. The thermal electric devices 162 are preferably in intimate contact with the outer surface of the tank 120.

The temperature control unit 20 further includes an outer shell or housing 170, which can surround the tank 120 and the heat exchanger apparatus 160 as shown in FIGS. 6-14. In one embodiment, the housing 170 includes an external or exterior upper housing 172 and an external or exterior base housing 174, each made from any suitable material such as stainless steel. The upper housing 172 is secured to the upper flange 136 of the tank 120 by any suitable means such as a plurality of circumferentially-disposed screws or other fasteners. The upper housing 172 is also secured to the lower flange 138 by means of a plurality of circumferentially-disposed brackets 176 screwed or otherwise fastened to the lower flange 138 and a plurality of screws or other fasteners joining the upper housing 172 to the brackets 176 (see FIGS. 8, 9 and 13). The base housing 174 is formed with a cylindrical side wall and a substantially planar top wall and is secured to the lower flange 138 of the tank 120 by any suitable means. For example, the base housing 174 may be bolted to the plurality of circumferentially-disposed brackets 176.

The base housing may be open at its lower end or bottom, and the temperature control unit further includes inlet and outlet connectors 180 and 182 extending through the base housing 174 and accessible from the exterior of the housing 170 for providing a suitable fluid such as facility water to and from the heat exchanger apparatus 160. Such connectors 180 and 182, as illustrated in FIGS. 8-13, include portions accessible inside the base housing 174, which portions are connected to the respective inlets and outlets of the heat exchangers 160 by any suitable conduit such as tubing that for simplicity is not shown in any of the drawings.

Figure 9:
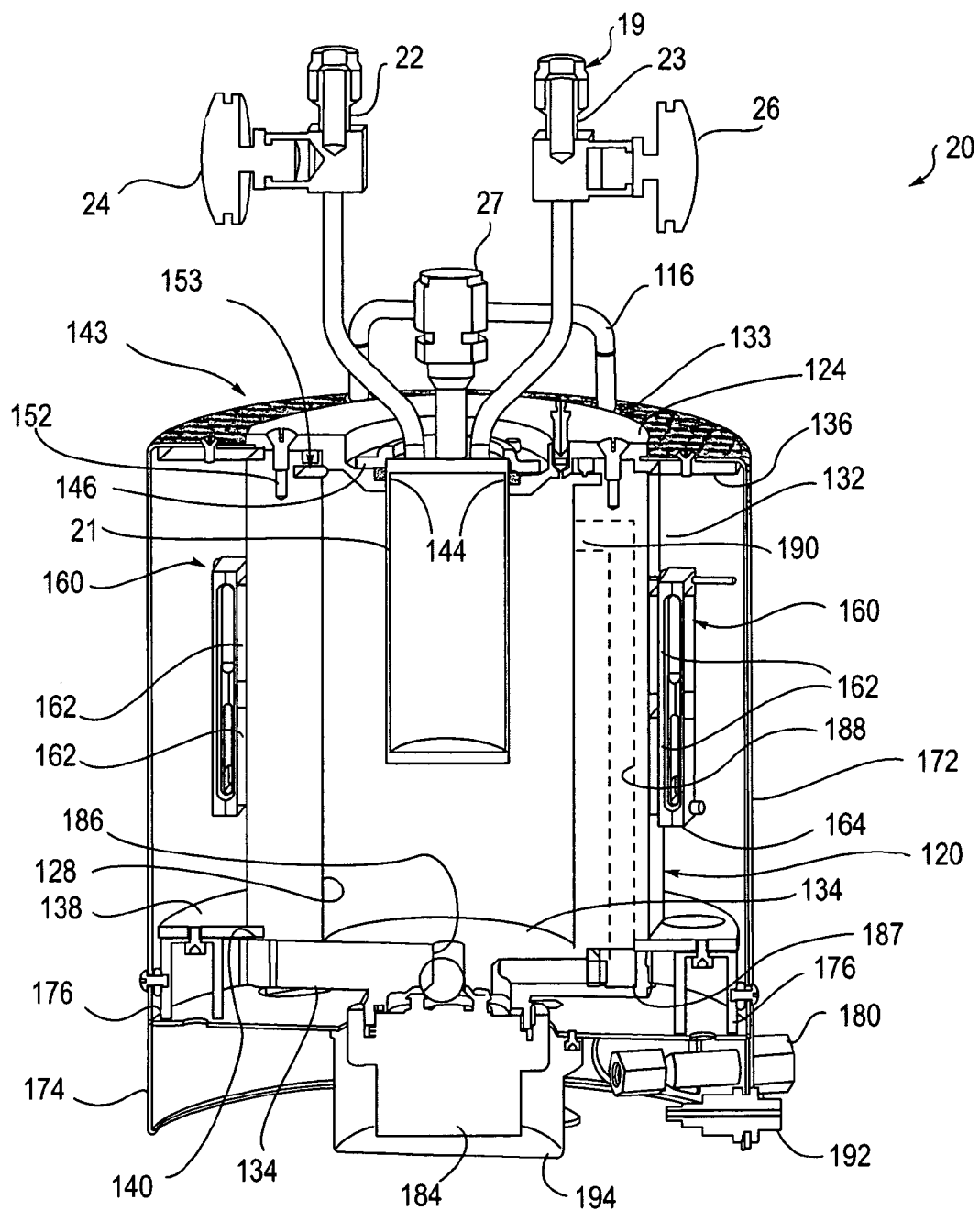
FIG. 9 is a cross-sectional view of the temperature control unit of FIG. 6 taken along the line 9-9 of FIG. 7.
Figure 13:
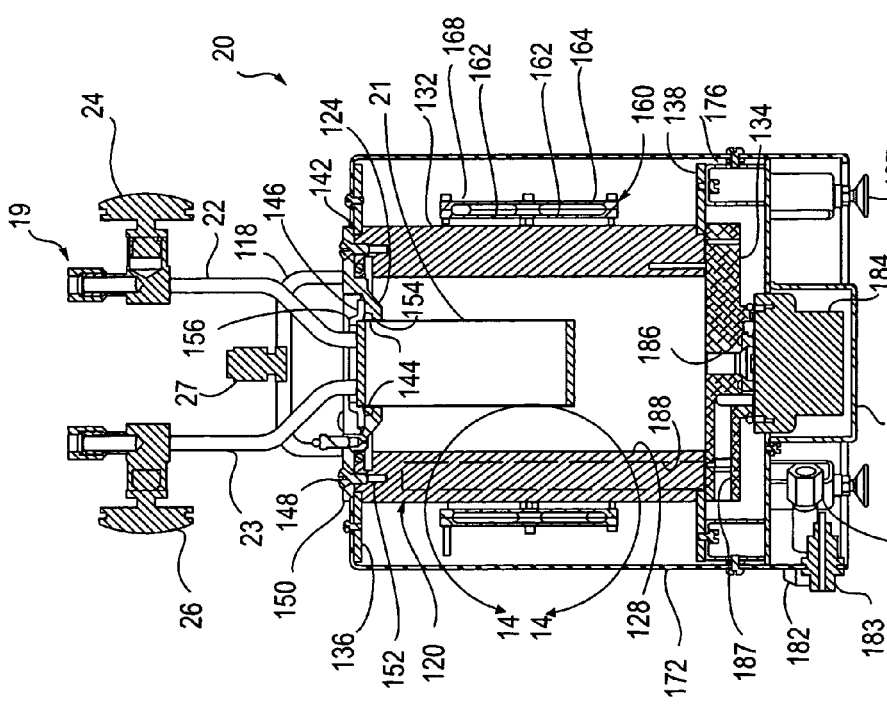
FIG. 13 is a cross-sectional view of the temperature control unit of FIG. 6 taken along the line 13-13 of FIG. 12.

The fluorinert, or other working liquid in the tank 120, is recirculated through the temperature control unit 20 by means of, for example, a pump 184, to facilitate the maintenance of the temperature of the working liquid at a desired level. In one embodiment, as shown in FIGS. 9 and 13, the pump 184 is mounted to the central portion of the base 134 of the tank 120 and extends downwardly through a central opening provided in the lower flange 138 of the tank 120. An inlet bore or port 186 is provided in the tank base and communicates with an inlet of the pump 184. Additionally, an outlet bore or port 187 is provided in the tank base and communicates at one end with an outlet of the pump 184 and at the other end with a recirculating inlet bore 188 that extends longitudinally through the cylindrical side wall 132 of the tank to an opening 190 into the internal chamber 128 of the tank 120 (see FIGS. 9 and 13). Opening 190 is provided near the top of the cylindrical side wall 132.

A fill or drain 192 for filling or draining the fluid in the tank 120 may also be provided. The fluid coupler or connector 192 extends through the base portion of the housing and serves as an inlet port or fill and an outlet port or drain for the working liquid used in the tank. The fluid coupler or connector 192 is fluidly coupled by any suitable means such as tubing to the pump gland (not shown). A cup-shaped housing 194 extends up and along the lower portion of the pump, that is that portion of the pump which extends below the lower flange 138 of the tank 120, and is secured to lower flange 138 by any suitable means such as a plurality of screws or other fasteners.

One or more temperature sensors (not shown) can be provided in the temperature control device or unit 20, for example within one or more of the heat exchanger apparatus 160, within the tank 120, within the bubbler 19 or within a combination of the foregoing, for monitoring the temperature of the fluorinert or other working liquid, the material within the bubbler 19 and any other temperature within the temperature control device 20 and for providing feedback to the controller 60. At least one of such temperature sensors is preferably disposed in the cylindrical side wall 132 of the tank 120 for monitoring the temperature of the fluorinert or other working liquid within the tank.

An electrical connector 196, shown most clearly in FIGS. 10 and 11, extends through the base portion 174 of the housing 170 for permitting electrical communication between the temperature control unit 20 and the controller 60. The electrical connector 196 is connected by any suitable means, for examples wires or flex circuits (not shown), to the thermal electrical devices 162 and the pump 184 of the temperature control unit 20. Communication is permitted between the connector 196 and the controller 60 by any suitable means such as the electrical cable 98 shown in FIGS. 4 and 5. The controller 60 can, for example, control the amount and polarity of the power to the thermal electric devices 162 in the heat exchanger apparatus 160 and the operation of the recirculation pump 184.

A plurality of legs 197 are mounted to the underside of the temperature control unit 20 for supporting the unit 20 on the stand 99 or other support surface. The legs 197 are individually adjustable for leveling the temperature control unit 20 relative to the support surface.

In operation and use, when it is desired to provide heat or cooling to the tank 120 so as to heat or cool the working liquid therein and thus the material within the bubbler container 21, energy of an appropriate polarity is provided to the thermal electric devices 162. Where for example cooling of the material within the bubbler 19 is desired, the surfaces of the thermal electric devices engaging the tank 120 serve to provide cooling to the tank. The heat generated by the opposite sides of the thermal electric devices 162, that is the sides engaging the heat exchanger 160, is absorbed by the facility water passing through the heat exchanger and removed from the temperature control device 20.

The inclusion of longitudinal bore 188 in the cylindrical wall 132 of the tank 120, as opposed for example to providing tubing from the outlet of pump 184 to the top of the tank 120, simplifies the design of the temperature control unit 20. The longitudinal bore 188 preferably extends beneath the thermal electric devices 162 of one of the heat exchanger apparatus 160 mounted on the exterior of the tank 120. As such, the bore 188 additionally serves to increase the heating or cooling of the working liquid by bring such liquid in closer communication with a heat exchanger apparatus 160 of the unit 20. It is appreciated that a plurality of longitudinal bores 188 can be provided in the cylindrical wall 132 of the tank 120 for returning the working liquid to the tank. For example, a longitudinal bore can extend beneath each of the heat exchanger apparatus 160 for further increasing the heating or cooling efficiency of the working liquid.

The location of controllers 91-96 outside of utility housing 88, and away from the temperature control units 20, reduces the possibility that the electronics within the controllers will be damaged by any gases within the sealed housing or enclosure 88. In addition, the sealing of each bubbler 19 in a temperature control unit 20, and the sealing of the working liquid of the temperature control unit therein, minimizes evaporation or other escape of the working liquid into the utility housing 88 or elsewhere and thus reduces the likelihood of damage of other controllers, electronics or sensitive instrumentation inside of the utility housing 88 from escaped working liquid. In addition to the foregoing, the sealing of the working liquid within the temperature control unit minimizes if not eliminates undesirable evaporation of the working liquid and thus reduces the frequency at which the reactor system or portions thereof must be stopped to replenish the working liquid.

Figure 15:
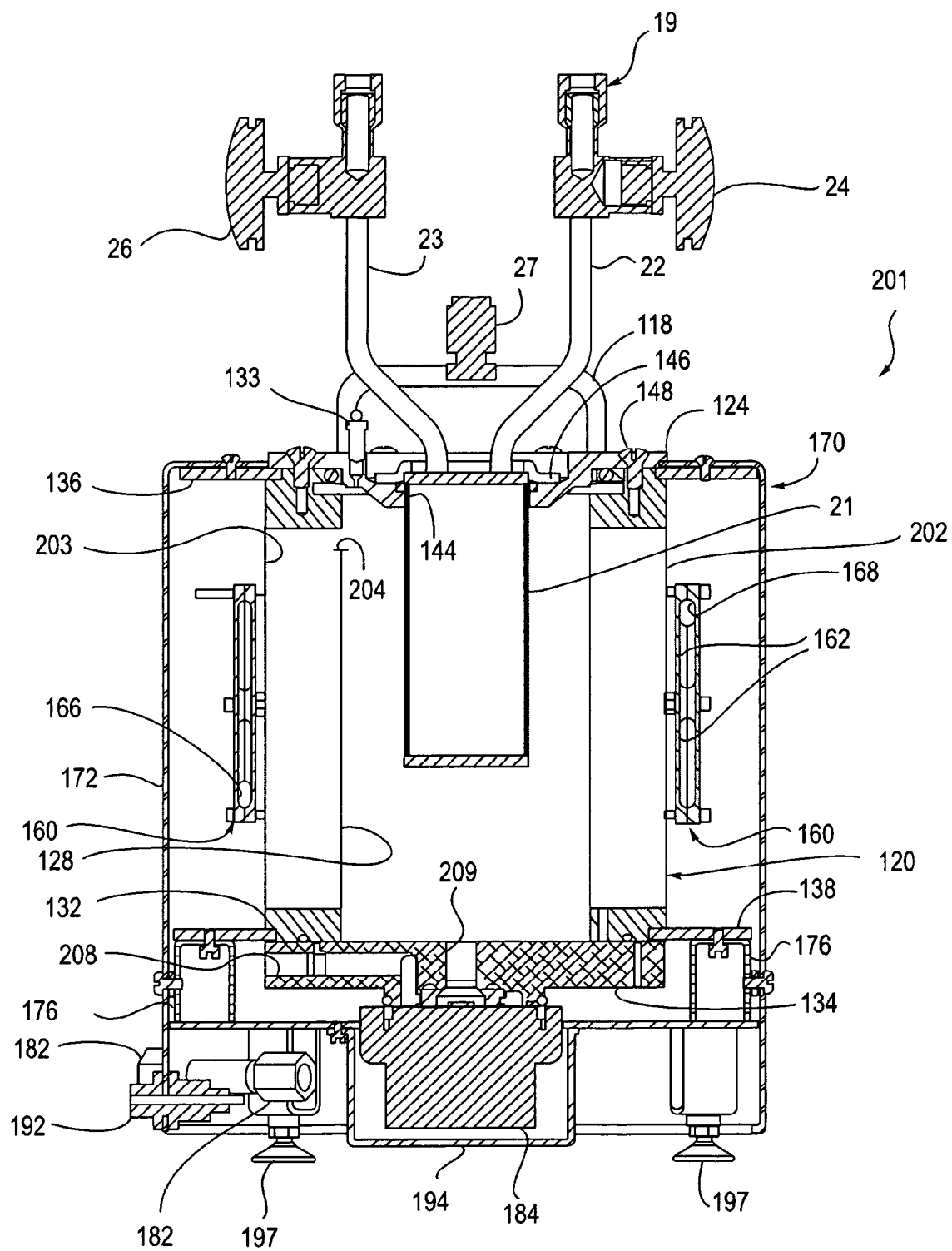
FIG. 15 is a cross-sectional view, similar to FIG. 13, of another embodiment of the temperature control unit of the present invention.

Other embodiments of the temperature control unit of the present invention can be provided. For example, a temperature control unit can be provided with an integrated expansion tank for facilitating the maintenance of a proper or desired level of working liquid in the internal chamber of the tank. One embodiment of a temperature control unit 201 having an integrated expansion tank is illustrated in FIG. 15. Temperature control unit or device 201 is substantially similar to temperature control unit 20 and like reference numerals have been used to describe like components of units 20 and 201. Although any suitable expansion tank can be provided, the expansion tank 202 in temperature control unit 201 consists of a chamber 203 that surrounds some or all of the internal chamber 128 of the tank 120. More preferably, the expansion tank is a cylindrical chamber, annular in cross section, which is formed in the cylindrical wall 132 of the tank 102 and concentrically disposed about the internal chamber 128 of the tank 120. One or more inlet ports 204, one of which is shown in FIG. 15, fluidly connect the internal chamber 128 of the tank 120 to the chamber 203 of the expansion tank and are preferably provided near the top of the expansion tank.

The pump flow in the temperature control unit 201 is reverse of the pump flow in temperature control unit 20. In this regard, a port or passageway (not shown) fluidly connects the bottom of the chamber 203 of the expansion tank 202 to an inlet passageway 208, similar in construction to outlet port 187 of temperature control unit 20, formed in planar base 134 of the tank 120 and coupled to the inlet of the pump 184. An outlet port 209, similar in construction to inlet port 186 of temperature control unit 20, is provided at the bottom of the tank 120 and fluidly coupled to the outlet of pump 184. Accordingly, the flourinert or other working liquid overflows from the internal chamber 128 into the chamber 203 of the expansion tank 202 by means of the one or more inlet ports 204 of the expansion tank 202. The flourinert or other working liquid in the expansion tank 202 then passes through the pump 184 and reenters the internal chamber 128 of the tank 120 through outlet port 209 in the bottom of the tank 120.

In operation and use, it is advantageous that the flourinert or other working liquid in the tank 120 be maintained at a level near the top of the internal chamber 128 of the tank so as to surround substantially all of the bubbler container 21 and better regulate the temperature of the material in the bubbler. It is advantageous that the expansion tank be included in the compact confines of the temperature control unit so as to minimize the footprint and size of the temperature control unit.

Initial specifications for solid state temperature control devices 20 and 201 provide for a cooling capacity of 100 watts at 20° C. and a heating capacity of 100 watts at 20° C., with an operational temperature range from −20° C. to +60° C. and the ability to provide a temperature with an accuracy of ±0.1° C. A water flow of 0.5 gallons per minute can be provided, and the temperature control units 20 and 201 each preferably has a mean time between failure, or MTBF, of 30,000 or more hours.

Figure 16:
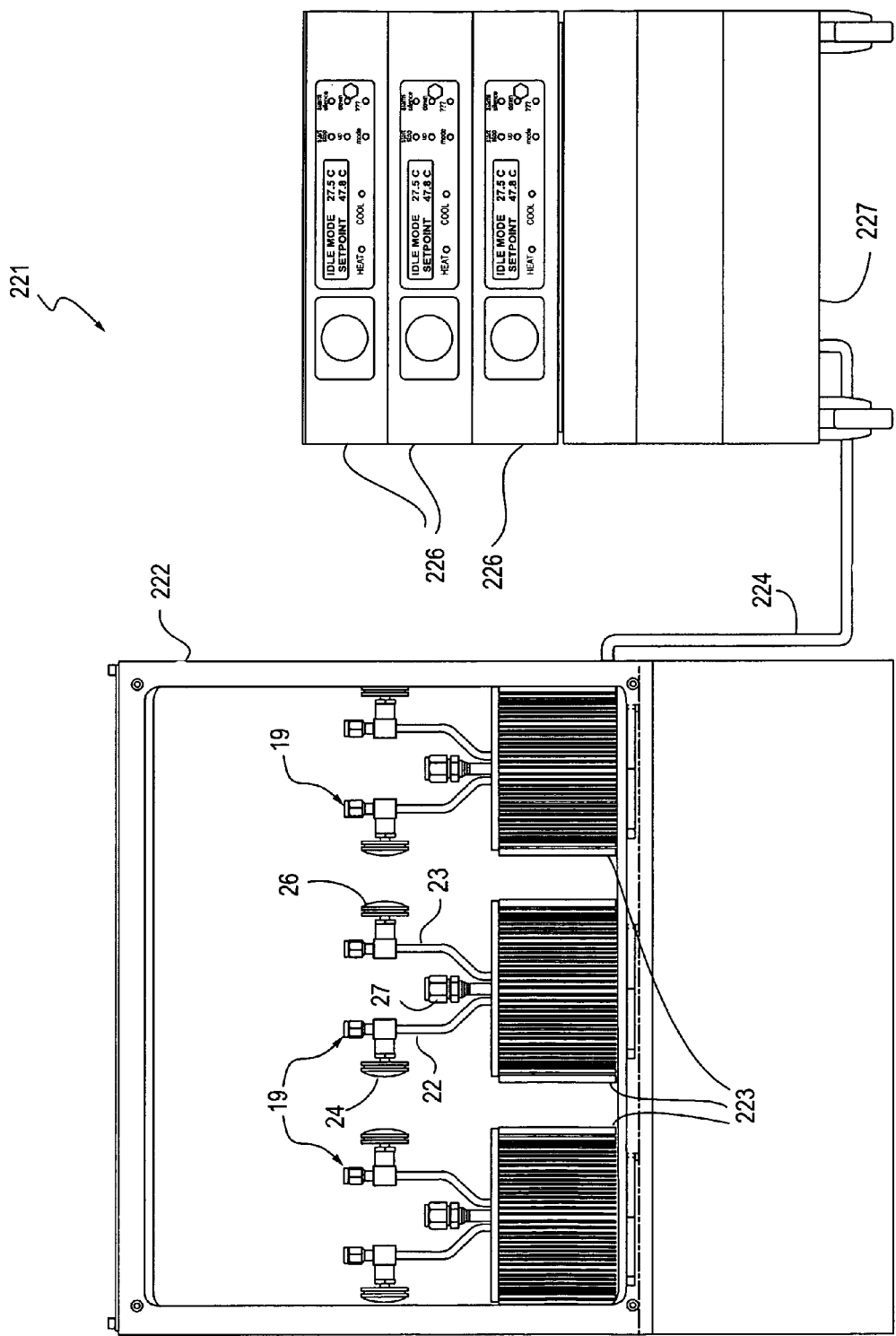
FIG. 16 is a front elevational view of another physical embodiment of a portion of the precursor material delivery system of FIG. 2 employing a plurality of temperature control units according to another embodiment of the present invention.

Other embodiments of the temperature control device of the present invention can be provided. The system 221 of FIG. 16, a portion of the precursor material delivery system 15, includes a reactor housing 222 having a plurality of any suitable temperature control units for controlling the respective temperature of a plurality of bubblers disposed therein and arranged in any suitable configuration. Any suitable bubbler, such as bubbler 19, can be used with system 221. In one preferred embodiment, each of the bubblers 19 contains a different material for use in a semiconductor manufacturing process and each of the temperature control units is a liquid-free temperature control unit or chiller 223. The flow of the material from the chillers 223 is controlled from electronics (not shown) in the reactor housing or enclosure 222 of the semiconductor manufacturing equipment. Portions of three liquid-free temperature control units 223 are shown in a spaced-apart linear configuration within electronics enclosure 222. Each of the temperature control units 223 is electrically coupled, for example by an electrical cable 224, to a respective controller 226 disposed remote of the temperature control device 223 and preferably outside of housing or enclosure 222. Such remote controllers 226 can be disposed in a suitable enclosure such as a movable rack 227. Each of the controllers includes a power supply and the necessary electronics for controlling the operation of the respective temperature control unit. It is appreciated that a single controller can be provided for operating a plurality of temperature control units, for example one controller can operate two, three, four, five or even all of the temperature control units of the system.

Each of the chillers 223 includes a tank 236 or other container for receiving the bubbler 19. In one preferred embodiment, tank 236 has an internal chamber 237 and an open top end 238 and is made from any suitable material such as stainless steel, aluminum or copper and preferably aluminum. The tank can be formed in any suitable manner and, as illustrated when assembled in FIG. 20, includes a cylindrical side wall 241 and a generally planar plate assembly 242 secured to the lower end of the side wall 241 by any suitable means such as bolts, screws or other fasteners 243. The outer surface 244 of the side wall 241 can be corrugated, scalloped or otherwise formed so as to improve heat transfer from the exterior of the side wall and thus the tank. The tank 236 and the chamber 237 thereof are sized and shaped so as to receive most currently available bubblers 19.

Plate assembly 242 is preferably circular in plan and is formed from a first or upper isolation plate 246 and a second or bottom plate 247. One or more temperature-changing devices, such as one or more thermal electric devices 248, are included in the plate assembly 242 and sandwiched between the first and second plates 246 and 274. Bottom plate or heat sink 247 is made from any suitable material such as stainless steel, aluminum or copper and preferably aluminum and is secured to the cylindrical side wall of the tank by any suitable means such as the plurality of bolts, screws or other fasteners 243. In one preferred embodiment, a plurality of circumferentially-disposed fasteners 243 extend upwardly through respective bores in the bottom plate 247 for threadedly seating in threaded bores provided in the bottom surface of the cylindrical side wall 241. Isolation plate is made from any suitable material such as stainless steel, aluminum or copper and preferably aluminum and is secured to heat sink 247 by any suitable means such as a plurality of bolts, screws or other fasteners 248. More specifically, a plurality of five fasteners 248 extend downwardly through respective bores in the isolation plate 246 for threadedly seating in threaded bores provided in the bottom plate 247.

An O-ring 251 or other suitable sealing structure is preferably provided between the isolation plate 246 and the cylindrical side wall 241 of the tank for creating a fluid-tight seal between the isolation plate and the side wall. In this regard, the isolation plate 246 seats within the low end of wall 241 and the outer annular surface of the isolation plate is provided with an annular groove 252 extending therearound. The O-ring 251, made from rubber or any other suitable elastomeric material, is seated within such groove 252 and fluidly engages both the outer annular surface of the isolation plate 246 and the inner annular surface of the side wall 241. Such fluid engagement of O-ring 251 with both the isolation plate 246 and the cylindrical side wall 241 permits the cylindrical side wall and the isolation plate to serve as a secondary containment vessel for the material within the chiller 19. The O-ring additionally serves to thermally insulate the isolation plate 246 from the cylindrical side wall 241. Further in this regard, an air gap is provided between the outer periphery of the isolation plate and the inside of the cylindrical side wall for enhancing the thermal isolation between these members.

One or more thermal electric devices 253 or other suitable temperature-changing devices are disposed between the isolation plate 246 and the bottom plate 247 (see FIGS. 18-20).

A layer of any suitable thermally-conductive material 256, such as plastic, is disposed on the top of isolation plate 246 for engaging the bottom surface of bubbler 19 and thus enhancing thermal conductivity and transfer between the bubbler and the isolation plate. A heater 257 preferably engages at least a portion of the outer surface of the bubbler container 21 for providing heat, if desirable, to the bubbler 19 and the material contained therein. Although any suitable heater can be used, in one preferred embodiment heater 257 is a silicon electrical heater that extends circumferentially around the tubular side wall of the bubbler container 21. The cylindrical side wall 241 of the chiller 223 is diametrically sized to snugly engage the outer surface of the heater 257. In this manner, the heater 257 is sandwiched between the bubbler 19 and the cylindrical side wall 241 (see FIGS. 19 and 20).

Temperature control unit or chiller 223 can include a lid or cover that is sized and shaped for the specific bubbler being used with the unit. For example, as shown in FIGS. 17-20, the temperature control unit 223 is provided with an enclosure member such as clamp 261, made from any suitable material and preferably a thermal insulative material such as plastic, for securing the bubbler 19 within the tank 236. It is appreciated that any suitable structure, enclosure member or assembly can be provided for securing and possibly sealing the bubbler within the tank and that any such structure or assembly can be designed and constructed to accommodate a plurality of bubblers of different sizes, shapes and dimensions. In the illustrated embodiment, the removable annular-shaped clamp 261 is disposed around the top of the bubbler container 21 and pressed against the bubbler container. The split-ring clamp 261, that is a ring formed from two semicircular halves 261—one of which clamp halves is shown in FIGS. 19 and 20, is removably secured to the top of the cylindrical side wall of the tank by any suitable means such as, for example, a plurality of circumferentially-disposed bolts, screws or other fasteners 263 that extend through respective bores provided in the clamp 261 and threadedly seat within respective bores provided in the cylindrical side wall 241. The interior rim of each half 262 of the clamp 261 is preferably formed with a shoulder 264 which secures the position of the bubbler 19 inside of the tank 236. An O-ring or any other suitable sealing structure (not shown) can be provided between the clamp 261 and the cylindrical side wall 241 of the chiller 223 and between the clamp 261 and the bubbler 19 if it is desired to seal the bubbler within the tank.

An electrical connector (not shown in the drawings) is provided for permitting electrical connections with the electrical heater 257 and the thermal electric devices 253 from the exterior of the temperature control device 223. The electrical connector is connected by any suitable means, for examples wires or flex circuits (not shown in the drawings), to the heater 257 and the thermal electrical devices 253. Communication is permitted between the electrical connector and the controller 60 by any suitable means such as electrical cable 224. The controller can, for example, control the amount of power to the heater 257 and the amount and polarity of the power to the thermal electric devices 253.

The temperature of the material within the bubbler 19 can be controlled by any suitable means in system 221. In this regard for example, heater 257 serves to increase the temperature of the bubbler container 21 and thus the material therein when needed. The thermal electric devices 253 serve to provide cooling to the bubbler container 21 and the material therein. Specifically, the thermal electric devices provide direct cooling to the isolation plate 246, which transfers such cooling to the bubbler container 21 and the material therein. The layer of thermally-conductive material 256 serves to increase the transfer of cooling from the isolation plate to the bubbler container. The heat generated by the reverse side of the thermal electric devices 253 is absorbed by the bottom plate 247, which serves as a heat sink. The heat from the bottom plate is absorbed by the cylindrical side wall 241 of the tank 236, and the outer corrugated surface of the tank facilitates dissipation of such heat into the atmosphere. It is appreciated that the thermal electric devices 253 can also be utilized to provide heat to the bubbler container 21.

One or more temperature sensors (not shown) can be provided in the temperature control device 223, for example in tank 236, within the bubbler 19, between the isolation plate 246 and the bottom plate 247 or a combination of the foregoing, for monitoring the temperature of the material within the bubbler 19 and any other temperature within the temperature control device 223 and providing feedback to the controller 60.

Initial specifications for solid state temperature control device 223 provide for a cooling capacity of 100 watts at 20° C. and a heating capacity of 100 watts at 20° C., with an operational temperature range from −20° C. to +90° C. and the ability to provide a temperature with an accuracy of ±0.1°

C. A water flow of 0.5 gallons per minute can be provided, and the temperature control unit 223 preferably has a mean time between failure, or MTBF, of 30,000 or more hours.

Temperature control device 223 is advantageous in that it does not contain any liquid, for example a fluorinert, facility water or other liquid, for passing through the tank 236 to remove heat or cold from the thermal electric devices 253. The absence of liquid can be advantageous where there is concern that the presence of liquid in the temperature control device will harm the electronics or other components of the process reactor system. The inclusion of a heater 257 that is separate from the thermal electric devices 253 can be advantageous, for example because the heater can be configured to provide more heat than the thermal electric devices and can provide a quicker response time between cooling and heating as compared to a device wherein a thermal electric device is tasked for providing both cooling and heating. The temperature control device 223 includes a secondary containment vessel, that is the tank 236, for protecting against the leakage of any material within the bubbler 19 into the system 221.

We claim:

1. A temperature control device for use in a process reactor system with a liquid and a bubbler, the bubbler having a container provided with a side wall having a top end, the temperature control device comprising a liquid-tight vessel having an internal chamber adapted to receive the liquid and the container of the bubbler so that the container is disposed in the liquid up to the top end of the side wall of the container, a sealing structure distinct from the vessel that has an opening through which the bubbler protrudes and is extendable between the vessel and the top end of the side wall of the container of the bubbler, the vessel having a top portion provided with a first port and a bottom portion provided with a second port, an expansion tank disposed at least partially around the vessel and in communication with the internal chamber, a circulation system including a pump coupled to the second port for circulating the liquid within the internal chamber and into the expansion tank, a temperature-changing device coupled to the expansion tank for providing heat or cold to the liquid in the expansion tank, the circulation system facilitating control of the temperature of the liquid in the internal chamber by circulating liquid from the expansion tank into the internal chamber, the sealing structure being removably secured to the vessel for sealing the liquid within the internal chamber during circulation of the liquid.

2. The temperature control device of claim 1 further comprising the liquid disposed in the internal chamber.

3. The temperature control device of Claim 1 wherein the expansion tank is concentrically disposed around the vessel.

4. The temperature control device of claim 1 wherein the temperature-changing device is mounted on the vessel.

5. The temperature control device of claim 4 further comprising an additional temperature-changing device mounted on the vessel.

6. The temperature control device of claim 5 wherein the first-named temperature-changing device and the additional temperature-changing device each include a thermal electric device and wherein the vessel, the first-named temperature-changing device and the additional temperature-changing device are disposed in a compact housing, further comprising a controller electrically coupled to the thermal electric devices of the first-named temperature-changing device and the additional temperature-changing device.

7. The temperature control device of claim 1 wherein the temperature-changing device is a thermal electric device.

8. The temperature control device of claim 7 further comprising a heat exchanger disposed in the thermal electric device.

9. The temperature control device of claim 7 wherein the vessel includes a side wall and a bottom wall and wherein the thermal electric device engages one of the side wall and the bottom wall of the vessel.

10. The temperature control device of claim 9 further comprising a heater engaging one of the side wall and the bottom wall of the vessel.

11. A temperature control device for use with a liquid and a bubbler, the bubbler having a container provided with a top end in a process reactor system, the temperature control device comprising a vessel having a liquid-tight internal chamber adapted for receiving the liquid and the bubbler so that the bubbler is disposed in the liquid, a sealing structure distinct from the vessel that has an opening through which the bubbler protrudes and is extendable between the vessel and the top end of the container, the vessel having a top portion provided with a first port and a bottom portion provided with a second port, an expansion tank disposed at least partially around the vessel and in communication with the internal chamber, a circulation system including a pump coupled to the second port for circulating the liquid within the chamber and into the expansion tank, a thermal electric device coupled to the expansion tank for providing heat or cold to the liquid in the expansion tank, the circulation system facilitating control of the temperature of the liquid in the chamber by circulating liquid from the expansion tank into the internal chamber, the sealing structure being removably secured to the vessel for sealing the liquid within the internal chamber during circulation of the liquid.

12. The temperature control device of claim 11 wherein the thermal electric device includes a plurality of thermal electric devices circumferentially disposed about the vessel.

13. The temperature control device of claim 11 wherein the vessel, the thermal electric device, the circulation system and the expansion tank are disposed in a compact housing, further comprising a controller electrically coupled to the thermal electric device.

14. The temperature control device of claim 11 wherein the sealing structure includes an enclosure member extendable between the container of the bubbler and the vessel.

15. The temperature control device of claim 11 wherein the expansion tank is concentrically disposed about the vessel.

16. A temperature control device for use with a liquid and a bubbler, the bubbler having a liquid-tight container provided with a top end, in a process reactor system, the temperature control device comprising a vessel having a liquid-tight internal chamber adapted for receiving the liquid and the bubbler so that the bubbler is disposed in the liquid, a sealing structure distinct from the vessel that has an opening through which the bubbler protrudes and is extendable between the vessel and the top end of the container, the vessel having a top portion provided with an outlet port and a bottom portion provided with an inlet port, an expansion tank disposed at least partially around the vessel and in communication with the outlet port, a circulation system including a pump coupled to the inlet port for circulating the liquid through the internal chamber from the inlet port to the outlet port and into the expansion tank, the sealing structure being removably secured to the vessel for sealing the liquid within the internal chamber during circulation of the liquid, a thermal electric device coupled to the expansion tank for providing heat or cold to the liquid in the expansion tank, the circulation system facilitating control of the temperature of the liquid in the internal chamber by circulating liquid from the expansion tank into the internal chamber.

\* \* \* \* \*